(12) United States Patent  (10) Patent No.: US 8,907,228 B2
Huang et al.  (45) Date of Patent: Dec. 9, 2014

(54) CIRCUIT STRUCTURE OF ELECTRONIC DEVICE AND ITS MANUFACTURING METHOD

(75) Inventors: Wen-Fu Huang, Zhongli (TW); Shih-Ching Chen, Zhongli (TW); Chen-Hui Cheng, Pingzhen (TW); Meng-Hsueh Wu, Taipei (TW)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 198 days.

(21) Appl. No.: 13/411,650

(22) Filed: Mar. 5, 2012

(65) Prior Publication Data

US 2013/0043061 A1 Feb. 21, 2013

(30) Foreign Application Priority Data

Aug. 19, 2011 (TW) .............................. 100129706 A

(51) Int. Cl.
 *H05K 1/11* (2006.01)
 *H05K 3/02* (2006.01)
 *H05K 3/10* (2006.01)
(52) U.S. Cl.
 USPC ............................................ 174/261; 29/846

(58) Field of Classification Search
 USPC ...................................... 174/261; 29/846–854
 See application file for complete search history.

(56) References Cited

U.S. PATENT DOCUMENTS

| 5,717,556 A | * | 2/1998 | Yanagida | ...................... 361/803 |
| 2011/0030999 A1 | * | 2/2011 | Lee et al. | ...................... 174/255 |

FOREIGN PATENT DOCUMENTS

TW 200948244 11/2009

* cited by examiner

*Primary Examiner* — Jeremy C Norris
(74) *Attorney, Agent, or Firm* — Gokalp Bayramoglu

(57) ABSTRACT

The present disclosure related to circuit structure of an electronic device, wherein the circuit structure comprises of a main line formed on a substrate; and at least an auxiliary line electrically connected to the main line to form a conductive return circuit used for a signal to pass through the auxiliary line when the main line is disconnected. Addition of the auxiliary line avoids any breaking of signal transmission due to partial disconnection of the main line. The present disclosure also relates to a method for manufacturing the circuit structure, wherein the method simplifies the manufacturing process and also reduces the rate of deformation or disconnection of lines.

20 Claims, 4 Drawing Sheets

U.S. 8,907,228 B2

CIRCUIT STRUCTURE OF ELECTRONIC DEVICE AND ITS MANUFACTURING METHOD

This Application claims priority to Taiwan Patent Application No. 100129706 filed on Aug. 19, 2011.

BACKGROUND OF THE INVENTION

1. Field of the Invention

The present disclosure relates to circuit structure of an electronic device and a method for manufacturing the same. More particularly, the present disclosure relates to a circuit structure applied to a touch panel.

2. Description of the Related Art

In recent years, touch interface has been widely applied in various electronic products such as notebook computers, mobile phones, personal digital assistants and digital cameras, wherein the touch interface has replaced the traditional keyboard or the mouse input models. A touch interface design omits traditional input devices from being used and makes a user capable of entering data and browsing simultaneously screen in the same touch interface. However, with fast development of new electronic products, need for touch interface based electronic products lies not only for making the products thin and light-weight, but also for enhancing the overall functionality of the products through large operative windows. Therefore, in order to ensure that the scope of touch panel and of the display operative window is large enough, portion of the non-visible region in the touch panel (namely the peripheral region) is required to be narrowed down as much as possible. But typically, during the process of narrowing, the line of signal transmission deforms or disconnects.

Generally, a method of narrowing a peripheral region of a touch panel includes reducing width of a line disposed in the peripheral region. In the method of reducing the width of the line, it is observed that singular line standing in the outermost side of the peripheral region is most liable to deform or disconnect. FIG. 1 is a schematic view of a circuit structure narrowed in a traditional touch panel, wherein the line 90 is the outermost side of a substrate in the peripheral region, having a serration portion 91 or a rupture portion 92. As line 90 is too thin, any serration or rupture leads to a state of instability during signal transmission or can even lead to disconnection.

SUMMARY OF THE INVENTION

An objective of the present disclosure is to provide circuit structure of an electronic device by taking advantage of auxiliary lines to solve issues of deformation or disconnection in traditional circuit structures.

Circuit structure of an electronic device of the present disclosure comprises of: a main line formed on a substrate; and at least one auxiliary line electrically connected to the main line to form a conductive return circuit for signals to pass through the auxiliary line when the main line gets disconnected.

A method for manufacturing a circuit structure of an electronic device of the present disclosure comprises disposing a main line and an auxiliary line electrically connected to the main line on a substrate simultaneously.

In present disclosure, the main line and the auxiliary line form a return circuit, so when some part of the main line is disconnected touch signals can avoid the disconnection and also can return to the main line by the auxiliary line. Moreover, in the printing manufacturing process of the present disclosure, ink for printing the auxiliary line and the main line comprises of at least two supporting point for supporting two ends of a scraper to keep balance. Ink for printing the auxiliary line increases frictional force between the scraper and the printed ink and therefore while scratching the ink, the scraper does not deflect, thereby avoiding deformation of the line. In addition, the present disclosure provides a method for manufacturing a circuit structure that simplifies the manufacturing process by printing all the lines on the substrate at one time.

The present disclosure also reduces the rate of generating disconnection and deformation in the peripheral lines and effectively promotes product yield.

The following description is combined with drawings and includes embodiments that conduct detailed description for the disclosure.

DETAILED DESCRIPTION OF THE EMBODIMENTS

In accordance with usual meaning of "a" and "the" in patents, reference, for example, to "a" line or "the" line is inclusive of one or more lines. In the present disclosure, use of singular includes plural and vice versa unless specifically stated otherwise, for example, the term "main line" includes singular and plural forms. The section headings used herein are for organizational purposes only, and are not to be construed as limiting the subject matter described.

Detailed description of the present disclosure is discussed in following embodiments, which are not intended to limit the scope of the present disclosure, but still can be adapted for other applications. As drawings are illustrated in detail, it would be appreciated that quantity of the disclosed components could be greater or lesser than disclosed, except those components with express restricting amount.

First Embodiment

Figure 1:
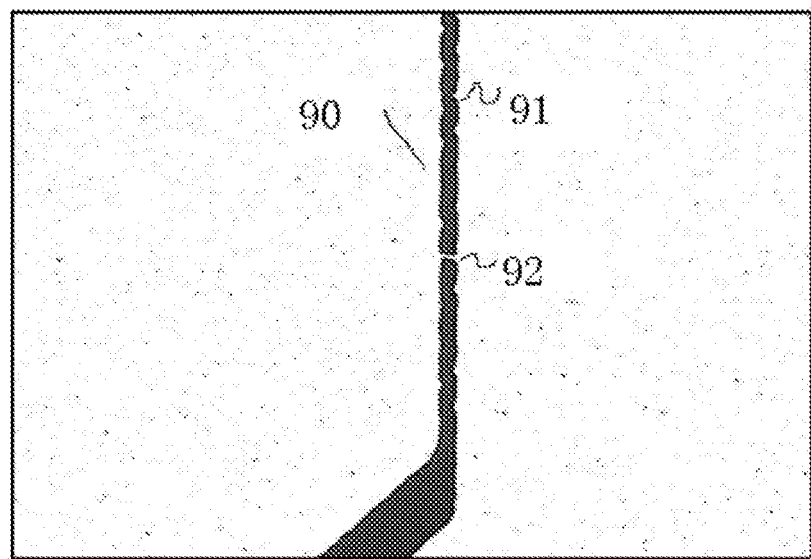
FIG. 1 is a schematic view of a circuit structure being narrowed in a traditional touch panel.
Figure 2:
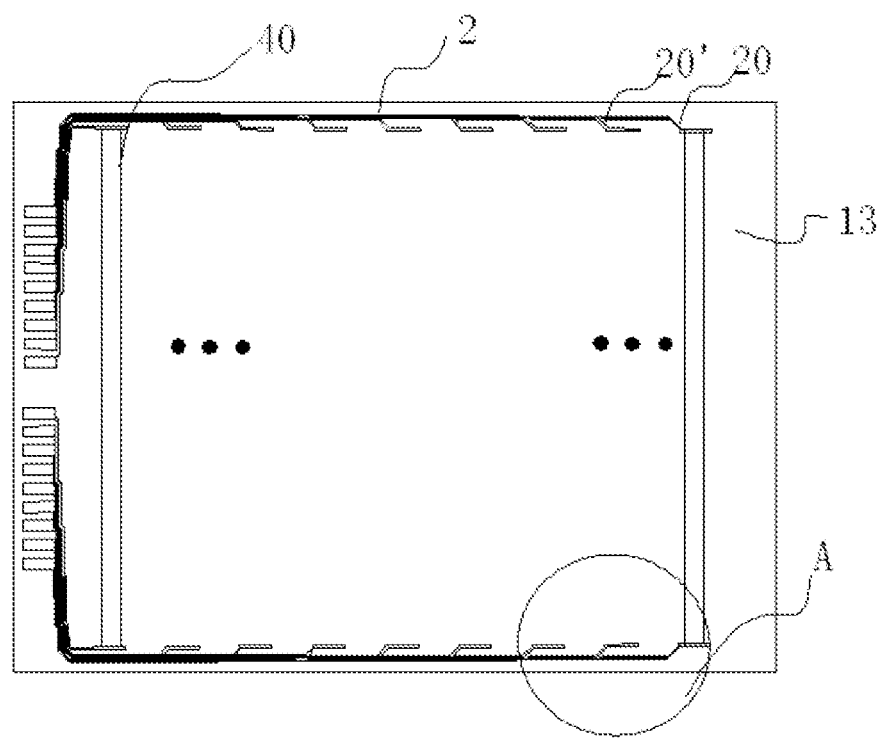
FIG. 2 is a schematic view of a circuit structure in an electronic device according to a first embodiment of the disclosure.

The embodiment is illustrated with reference to FIG. 2 and FIG. 3B herein. As shown in FIG. 2, a circuit structure includes multiple mutually-parallel main lines 2 with different lengths. Main lines 2 of the circuit structure symmetrically are distributed on both sides of a substrate 13, wherein each main line 2 is distributed along periphery of the substrate 13. One end of each main line is connected with a control circuit (not shown) and the other end is linked to an electrode layer 40. The electrode layer 40 is formed on a non-peripheral region of the substrate. FIG. 2 shows part of electrodes and omits the other electrodes in order to simplify the illustration. When a finger or a stylus closely approaches the touch panel or touches the touch panel, changes in electrical signals occur, which are transmitted to the control circuit from the electrode layer 40 through the main lines 2 and the control circuit then determines touch position on the panel. In this embodiment, the electrode layer 40 is a singular homotaxial layer, but, in actual implementation, can also be of any other type such as a singular double-shaft layer or a double-shaft bi-layer, wherein the electrode layer 40 can be made up of transparent conductive materials or other conductive materials.

Figure 3A:
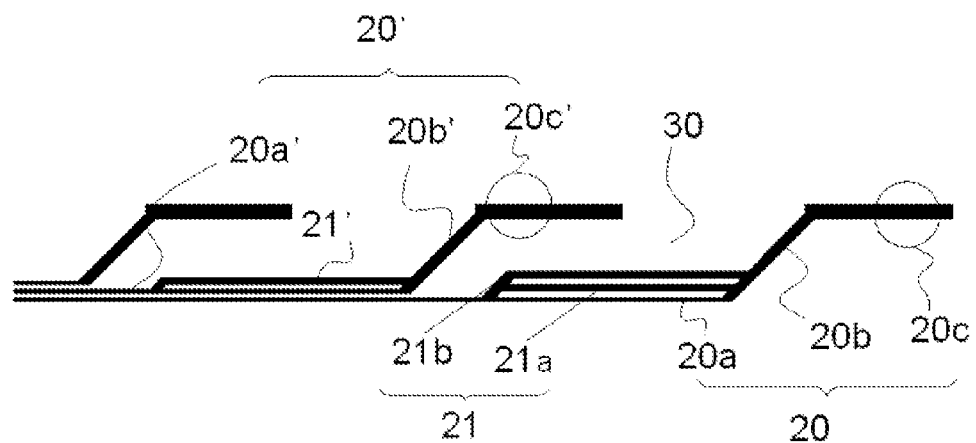
FIG. 3A is a part enlarged view of an area A of FIG. 2.

More specifically, the circuit structure includes the main line 20 located in outermost lateral periphery of the substrate 13 and the main line 20' located in the secondary lateral periphery, while the line between the main line 20 and its adjacent main line 20' is a singular line shown in FIG. 3A. FIG. 3A is a part enlarged view of area A of FIG. 2. The main line 20 has an auxiliary line 21, wherein the main line 20 is electrically connected with the auxiliary line 21 to form a conductive return circuit. More specifically, the main line 20 includes a lateral straight line 20a parallel to brim of the substrate 13, an extending line 20b inclined toward inside of the substrate 13, and an interconnecting line 20c linked to the electrode layer 40, wherein the extending line 20b is electrically connected with the lateral straight line 20a and the interconnecting line 20c. Furthermore, the auxiliary line 21 includes a first branch of the auxiliary line 21a and a second branch of the auxiliary line 21b. The first branch of the auxiliary line 21a is parallel to the lateral straight line 20a and is electrically connected with the extending line 20b by one end, while the other end is electrically connected with the second branch of the auxiliary line 21b, which is electrically connected with the lateral straight line 20a. More explicitly, the auxiliary line 21 is disposed in a semi-closed space 30 between the two adjacent main lines 20 and 20' and is electrically connected with corresponding main line 20 and is in non-electrical connection with the other adjacent main line 20'.

In present embodiment, the first branch of the auxiliary line 21a consists of two lines, both being parallel to and spaced from each other. Distance between the two lines can be controlled within a small scope of approximately 0.03 mm-2 mm. At the same time, line width of each line can also be controlled within a small scope of approximately 0.03 mm-2 mm. In another embodiment, length of the line distance plus the line width can also be controlled within a range of 0.06 mm-4 mm to reach the purpose of narrowing the lines and narrowing the peripheral region.

Moreover, the main line 20' is adjacent to the main line 20. Similarly, the main line 20' also includes a lateral straight line 20a' parallel to the substrate edge, an extending line 20b' inclined towards inside of the substrate 13, and an interconnecting line 20c' linked to the electrode layer 40. Specifically, the semi-closed space 30 particularly refers to the space enclosed by the lateral straight line 20a and the extending line 20b of the main line 20, and the extending line 20b' and the interconnecting line 20c' of the main line 20'. Structure of an auxiliary line 21', as shown in FIG. 2, is similar to that of the auxiliary line 21 and the auxiliary line 21' corresponds to the main line 20'. The only difference between the main line 20' and the main line 20 is the number of their auxiliary lines, wherein the main line 20 possesses two auxiliary lines 21 and the main line 20' one auxiliary line 21', thus herein the description is not made again.

From all above, since a closed conductive return circuit is formed by an auxiliary line 21 and a main line 20, signals can return to the main line 20 again by passing through the auxiliary line 21 when the main line 20 is disconnected, as the result of which is that interruption of signal transmission due to partial disconnection of the main line 20 is prevented. Moreover, the auxiliary line 21 is disposed in a semi-closed space 30 so that it does not need other space which increases the total peripheral area. In other words, layout of the auxiliary line narrows the peripheral area.

Figure 3B:
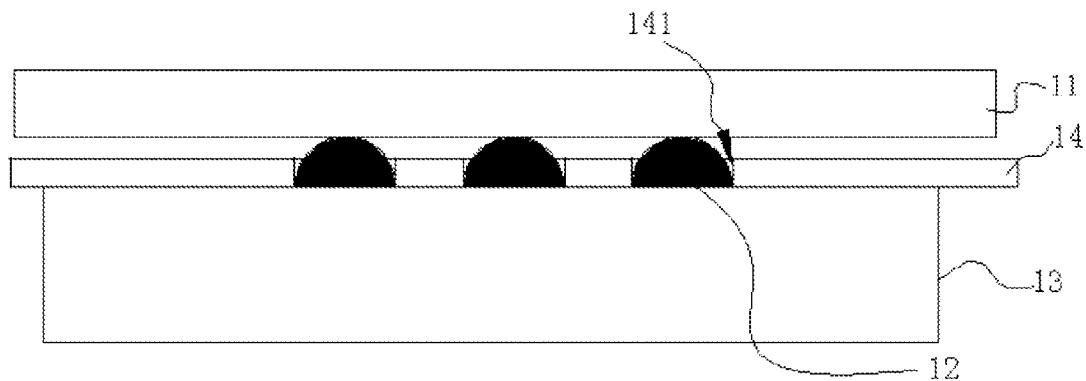
FIG. 3B is a schematic view of an electronic device during screen printing process according to the first embodiment of the disclosure.

Circuit structure as disclosed, can not only avoid interruption of signal transmission due to disconnection of the main line, but also prevents the singular main line from getting deformed. This is described more in detail hereinafter:

Referring to FIG. 3B, ink 12 is located in a through-hole 141 of a screen 14, wherein the ink 12 is a conductive ink such as silver glue, graphite, copper adhesive or other conductive materials. When a scraper 11 is subjected to pressure, the ink 12 is printed on the substrate 13 via the through-hole 141. Specifically, the ink 12 in FIG. 3B is used to form a main line 20 and two first branch of auxiliary lines 21a on the substrate 13 as shown in FIG. 3A. Moreover, the ink 12 constitutes three supporting points for sustaining the scraper 11. These points can favorably support both ends of the scraper 11 to keep balance and then avoid the deflection as one single supporting point can not balance the scraper 11. This support to the scraper 11 improves the condition of line deformation. Moreover, since the edge portion of the main line 20', which is adjacent to the main line 20, only includes two lines, namely the lateral straight line 20a' and the lateral straight line 20a, frictional force between the ink 12 and the scraper 11 is relatively small while printing the circuit. In order to reach a favorable effect, as shown in FIG. 3A, an auxiliary line 21' is correspondingly added to the main line 20' so as to increase frictional force and promote scraper stability.

In the present embodiment, even though the main line 20 includes two first branch of auxiliary lines 21a, the disclosure is not confined to the embodiment. If needed, the main line 20 can comprise three or more first branch of the auxiliary lines 21a. Moreover, even though in the present embodiment, auxiliary line 21 and auxiliary line 21' are respectively formed on the main line 20, which is located in the outermost lateral of both sides of the substrate 13, and on the main line 20', which is located in the second outermost lateral of both sides of the substrate 13, the configuration is not confined to this and the auxiliary lines 21 and 21' can be formed on other main lines of the substrate 13 simultaneously.

Second Embodiment

Figure 4A:
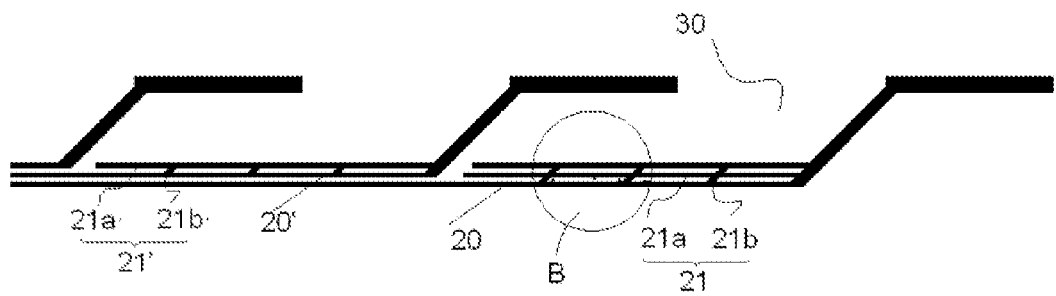
FIG. 4A is a schematic view of a circuit structure of an electronic device according to a second embodiment of the disclosure.

FIG. 4A is a schematic view of a circuit structure of an electronic device according to the second embodiment of the present disclosure. Distinction between the first embodiment and the second embodiment is that the second embodiment includes a plurality of second branch of auxiliary lines 21b while the first embodiment only includes one second branch of the auxiliary line 21b. Moreover, in the second embodiment, one end of the first branch of the auxiliary line 21a is in an open state, while in the first embodiment, both ends of the first branch of the auxiliary line 21a are closed, namely one end is connected with the second branch of the auxiliary line 21b and the other end is connected to extending line 20b of the main line 20.

In the second embodiment, every second branch of the auxiliary lines 21b is parallel to the other and perpendicularly crossed with the first branch of the auxiliary line 21a, wherein the second branch of the auxiliary line 21b is connected with the main line 20 at one end, and at the other end is linked to the first branch of the auxiliary line 21a. In an embodiment, the first branch of the auxiliary line 21a, the second branch of the auxiliary line 21b, and the main line 20 constitute multiple conductive return circuits.

Figure 4B:
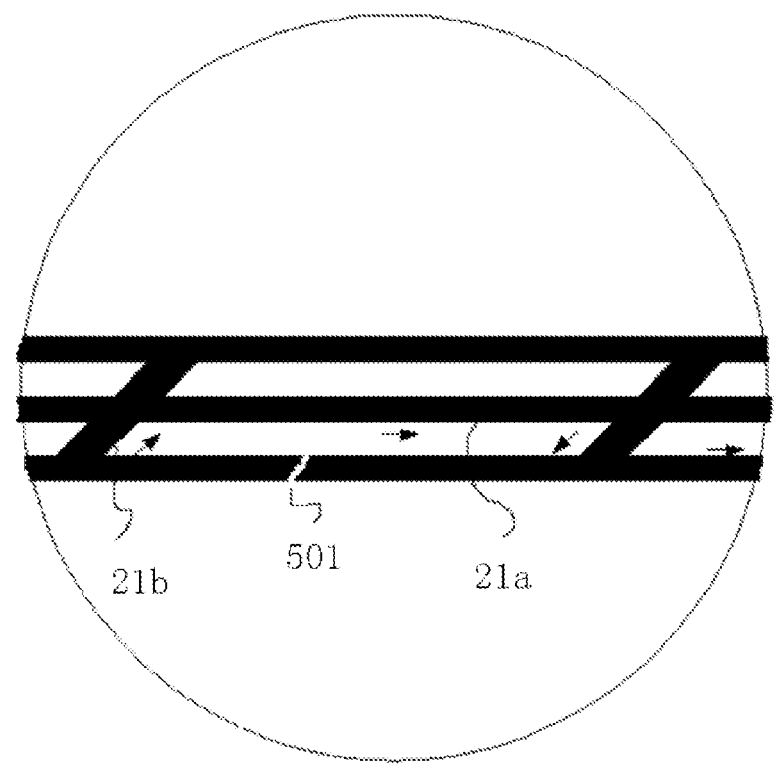
FIG. 4B is an enlarged view of area B of FIG. 4A.

When a finger or a stylus closely approaches or touches a touch panel, touch signals are transmitted to a main line 20 from electrodes, resulting in formation of multiple mutually-connected return circuits by first branch of auxiliary lines 21a, second branch of the auxiliary lines 21b, and the main line 20 or by the first branch of the auxiliary lines 21a and the second branch of the auxiliary lines 21b, allowing the touch signals to be transmitted through the first branch of the auxiliary lines 21a and the second branch of the auxiliary lines 21b due to the formed return circuit. Referring to FIG. 4B, which is an enlarged view of area B of FIG. 4A, two second branch of the auxiliary lines 21b intersect two first branch of the auxiliary lines 21a, and then the two second branch of the auxiliary lines 21b intersect the main line 20, so as to constitute the multiple return circuits. If partial disconnection 501 occurs in the main line 20, touch signals pass from the second branch of the auxiliary line 21b to the first branch of the auxiliary line 21a, and then finally through another second branch of the auxiliary line 21b to the main line 20. The arrow in FIG. 4B shows the direction of transmission of the current signals in the return circuit, which can avoid the disconnection of signal transmission.

An advantage of the embodiment is that a plurality of first branch of auxiliary lines 21a, a plurality of second branch of auxiliary lines 21b and a main line 20 can constitute a plurality of return circuits. The rate of interruption of touch signal transmission, which is caused by partial disconnection of the main line 20, can be further reduced by means of the return circuits. Moreover, frictional force between the scraper and ink is augmented by increasing the number of second branch of auxiliary lines 21b so as to make the scraper scratching the ink more steady and make the signal transmission more stable.

Shown in FIG. 4A, in the second embodiment, six return circuits are formed by three first branch of the auxiliary lines 21a, three second branch of the auxiliary lines 21b, and the main line 20, but the actual implementation is not confined to this configuration and any number of lines can be used. For example, an increase in the number of first branch of the auxiliary lines 21a or in the second branch of the auxiliary lines 21b can add to the number of return circuits. In addition, the number of first branch of the auxiliary lines 21a parallel to the main line 20 is not confined to two or more, that is to say, it can be only one. For example, in the present embodiment, main line 20', adjacent to the main line 20, is disposed with one first branch of auxiliary lines 21a' and three second branch of auxiliary lines 21b'. Similar to above embodiment, the main line 20', multiple first branch of the auxiliary lines 21a', and one second branch of the auxiliary line 21b' constitute multiple return circuits. In addition, in the present embodiment, even though the second branch of the auxiliary line 21b is perpendicularly crossed with the first branch of the auxiliary line 21a, the disclosure is not confined to this configuration; for example, the second branch of the auxiliary line 21b can obliquely cross the first branch of the auxiliary line 21a. Any modification or change made to the above described embodiments would be covered under the scope of protection of the present disclosure.

Figure 5:
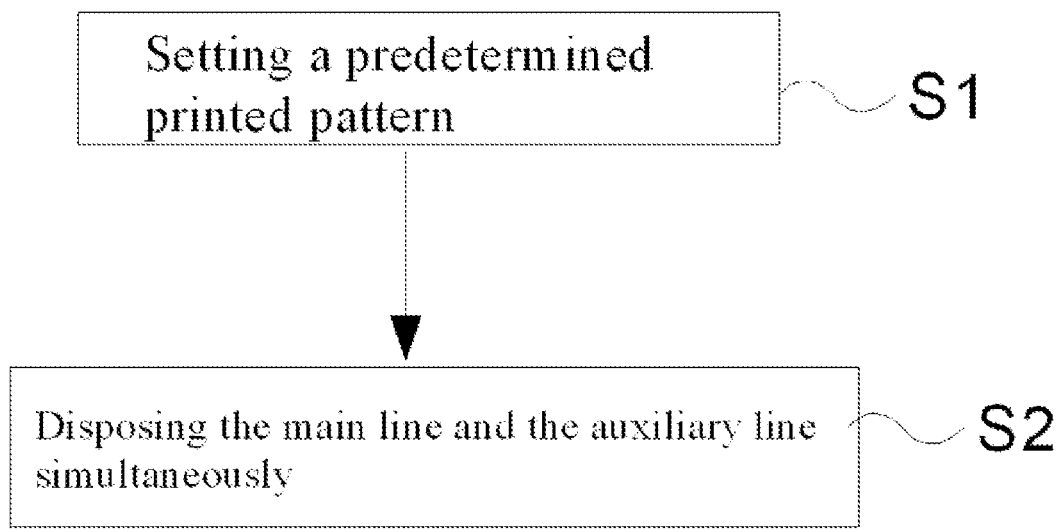
FIG. 5 is a flow chart of a method for manufacturing a circuit structure in an electronic device.

Present disclosure also provides a method for manufacturing a circuit structure for above discussed touch panel. FIG. 5 is a flow chart of the method for manufacturing the circuit structure in an electronic device. The method includes:

S1: Setting a predetermined printed pattern on a screen, that is to say, forming linear patterns on the screen in accordance with shape of an auxiliary line and a main line.

S2: Disposing the main line and the auxiliary line simultaneously on periphery of a substrate, wherein the main line is electrically connected with the auxiliary line. The step further includes printing of these lines together. These auxiliary lines include a first branch of the auxiliary lines and a second branch of the auxiliary lines. Moreover, the main lines not only include the main lines of the outermost lateral of the substrate periphery and their adjacent main lines of the secondary lateral, but also other main lines.

In the present embodiment, since the printing of all lines on the substrate is conducted at one time, the proposed method simplifies the manufacturing process and reduces the rate of line disconnection or deformation. As for proceeding constitutions of the lines and their connecting interrelations, they have been already described in the previous embodiment and a further description is not be made herein.

The above description only serves as a favorable embodiment of the disclosure. Any modifications, equivalent replacements, and changes produced in the spirit and principle of the disclosure would be contained in the scope of the disclosure protection.

What is claimed is:

1. A touch-sensing circuit structure of an electronic device, comprising:
   a transparent touch-sensing electrode layer formed on a substrate and in a non-peripheral area;
   a plurality of signal transmission circuits formed on the substrate and in a peripheral area, wherein each signal transmission circuit comprises a main line and at least one auxiliary line,
   wherein the main line is connected to said transparent touch-sensing electrode layer; and the auxiliary line electrically is connected to the main line to form a conductive return circuit used for signals to pass through said auxiliary line when said main line is disconnected.

2. The touch-sensing circuit structure of the electronic device as claimed in claim 1, wherein said auxiliary line comprises:
   a first branch connected electrically to said main line; and
   a second branch connected with the first branch and said main line.

3. The touch-sensing circuit structure of the electronic device as claimed in claim 2, wherein said main line includes a lateral straight line parallel to brim of said substrate, an extending line inclined towards inside of the substrate, and a connected line linked to said electrode layer, wherein the extending line electrically connects the lateral straight line with the connected line.

4. The touch-sensing circuit structure of the electronic device as claimed in claim 3, wherein said first branch is parallel to the lateral straight line of said main line and is electrically connected with said extending line of the main line, further wherein said second branch is electrically connected with said lateral straight line.

5. The touch-sensing circuit structure of the electronic device as claimed in claim 2, wherein said first branch is crossed with said second branch.

6. The touch-sensing circuit structure of the electronic, device as claimed in claim 2, wherein a distance between two first branches is between 0.03 mm and 2 mm.

7. The touch-sensing circuit structure of the electronic device as claimed in claim 2, wherein the width of said first branch is between 0.03 mm and 2 mm.

8. The touch-sensing circuit structure of the electronic device as claimed in claim 1, wherein the signal transmission circuits are symmetrically disposed on sides of said substrate.

9. The touch-sensing circuit structure of the electronic device as claimed in claim 1, wherein said transparent touch-sensing electrode layer is a singular layer.

10. The touch-sensing circuit structure of the electronic device as claimed in claim 1, wherein one end of said main line is connected to said transparent touch-sensing electrode layer and the other end is connected to a control circuit.

11. The touch-sensing circuit structure of the electronic device as claimed in claim 1, wherein said main line and said auxiliary line are made of conductive ink.

12. The touch-sensing circuit structure of the electronic device as claimed in claim 1, wherein said auxiliary line is disposed in a semi-closed space between two adjacent main lines.

13. The touch-sensing circuit structure of the electronic device as claimed in claim 1, wherein said main line comprises an outermost lateral main line standing in said substrate periphery, and a secondary lateral main line adjacent to said main line.

14. A method for manufacturing a touch-sensing circuit structure of an electronic device, comprising:
    forming a transparent touch-sensing electrode layer on a substrate and in a non-peripheral area; and
    forming a plurality of signal transmission circuits on the substrate and in a peripheral area, wherein each signal transmission circuit comprises a main line connected to said transparent touch-sensing electrode layer and at least one auxiliary line electrically connected to said main line, and the main line and the auxiliary line are formed on the substrate simultaneously.

15. The method for manufacturing the touch-sensing circuit structure of the electronic device as claimed in claim 14, wherein the step of forming a plurality of signal transmission circuits comprises a step of forming a first branch and a second branch.

16. The method for manufacturing the touch-sensing circuit structure of the electronic device as claimed in claim 15, wherein the first branch is crossed with the second branch.

17. The method for manufacturing the touch-sensing circuit structure of the electronic device as claimed in claim 14, wherein in the step of forming a plurality of signal transmission circuits, the signal transmission circuits are symmetrically disposed on sides of said substrate.

18. The method for manufacturing the touch-sensing circuit structure of the electronic device as claimed in claim 17, wherein in the step of forming a plurality of signal transmission circuits, said main line comprises a lateral straight line parallel to said substrate's brim, an extending line inclined towards inside of said substrate, and a connecting line linked to said electrode layer, wherein said extending line electrically connects the lateral straight line with the connecting line.

19. The method for manufacturing the touch-sensing circuit structure of the electronic device as claimed in claim 18, wherein said first branch is parallel to said lateral straight line of the main line and is electrically connected with said extending line of the main line, further wherein said second branch is electrically connected with the lateral straight line.

20. The method for manufacturing the touch-sensing circuit structure of the electronic device as claimed in claim 14, wherein in the step of forming a plurality of signal transmission circuits, the auxiliary line is disposed in a semi-closed space between two adjacent main lines.

\* \* \* \* \*